United States Patent [19]
Jung

[11] Patent Number: 6,008,115
[45] Date of Patent: *Dec. 28, 1999

[54] METHOD FOR FORMING STRUCTURE OF WIRES FOR A SEMICONDUCTOR DEVICE

[75] Inventor: Hyuck-Chai Jung, Chungcheongbuk-do, Rep. of Korea

[73] Assignee: LG Semicon Co., Ltd., Chungcheongbuk-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/997,587

[22] Filed: Dec. 23, 1997

[30] Foreign Application Priority Data

Apr. 10, 1997 [KR] Rep. of Korea ............. 97/13203

[51] Int. Cl.$^6$ ............. H01L 21/00; H01L 21/425; H01L 21/4763
[52] U.S. Cl. ............. 438/621; 438/637; 438/648
[58] Field of Search ............. 438/200, 233, 438/300, 659, 621, 637, 642, 648; 257/357, 751, 740

[56] References Cited

U.S. PATENT DOCUMENTS

| | | | |
|---|---|---|---|
| 4,833,519 | 5/1989 | Kawano et al. | 438/627 |
| 4,920,071 | 4/1990 | Thomas | 438/627 |
| 5,094,981 | 3/1992 | Chung et al. | 438/643 |
| 5,178,800 | 1/1993 | Juengling | 438/621 |
| 5,231,052 | 7/1993 | Lu et al. | 438/643 |
| 5,466,971 | 11/1995 | Higuchi | 257/751 |
| 5,587,331 | 12/1996 | Jun | 438/586 |

*Primary Examiner*—Carl Whitehead, Jr.
*Assistant Examiner*—William David Coleman

[57] ABSTRACT

Disclosed are a method for forming a structure of wires for a semiconductor device in which pads are formed for contact in cell regions as well as core regions and periphery regions where cell aspect ratios are very high, and a structure of wires so formed. The semiconductor device includes a semiconductor substrate arranged into cell regions and periphery and/or core regions, the periphery and/or core regions having a well formed in the semiconductor substrate, the semiconductor substrate being arranged into active regions and field regions, the semiconductor device also having field insulating layers in the field regions, plural gate structures on portions of the semiconductor substrate in the active regions, and impurity regions in the semiconductor substrate between the gate structures. The method includes the steps of: forming an interlayer insulating structure on the semiconductor device; forming contact holes through the interlayer insulating structure to expose the impurity regions; lining contact-hole-portions of the interlayer insulating layer with portions of a barrier layer, respectively, such that the portions of the barrier layer contact the impurity regions; forming conductive pads on the portions of the barrier layer such that remainders of the contact holes are filled; and forming a wire layer on each one of the conductive pads.

17 Claims, 4 Drawing Sheets

METHOD FOR FORMING STRUCTURE OF WIRES FOR A SEMICONDUCTOR DEVICE

BACKGROUND OF THE INVENTION

1. Field of the Invention

The present invention relates to a structure for contact wires in a semiconductor device and, more particularly, to a method for forming a structure of wires for a semiconductor device in which pads are formed for contact in cell regions as well as core regions and periphery regions when an aspect ratio of corresponding contact holes is very high, so as to obtain stable contact wiring.

2. Discussion of the Related Art

A conventional method for forming wires of a semiconductor device will be discussed with reference to the accompanying drawings.

FIGS. 1A to 1E are cross-sectional views showing process steps of a conventional method for forming wires of a semiconductor device. First, pads are formed only in a cell region which is shown at the left hand side of the figures, but not in a core region or a periphery region which is shown at the right hand side of the figures. Pads for the core region or periphery region are formed later; see FIG. 1E.

Referring initially to FIG. 1A, an active region and a field insulating layer are formed on the entire surface of a first conductive type semiconductor substrate 1. A second conductive type well 3 is formed beneath a predetermined area of surface of the semiconductor substrate 1. A first oxide layer, a polysilicon layer, a second oxide layer are successively formed and patterned by a photo etching process with using a mask for gate electrode formation, so as to form gate oxide layers 4, gate electrodes 5, and gate cap insulating layers 6.

Lightly doped impurity ions are implanted into the substrate 1 at both sides of every gate electrode 5 to form lightly doped drain (LDD) regions 7. Next, an oxide layer is deposited on the entire surface and then etched-back to form a sidewall insulating layer 8 on both sides of every gate electrode 5. Thereafter, heavily doped impurity ions are implanted into the exposed first conductive type semiconductor substrate 1 at sides of the sidewall insulating layer 8, thus forming source/drain regions 9.

A thin third oxide layer 10 is formed on the entire surface and then an interlayer insulating layer 11 is formed for planarization by a chemical vapor deposition (CVD) process. Subsequently, a photo resist film 12 is coated on the entire surface and then partially patterned by an exposure and development process to remain over the gate electrodes 5 in the cell region which is shown at left hand of the figures.

Referring to FIG. 1B, using the photo resist pattern 12 as a mask, the interlayer insulating layer 11 and the third oxide layer 10 are anisotropically etched to expose the source/drain regions 9, thus forming contact holes.

Referring to FIG. 1C, a polysilicon layer 13 is formed on the entire surface, thus the contact holes of the cell region and the periphery region and core regions. Subsequently, another photo resist film 14 is coated on the entire surface and then patterned by an exposure and development process so as to remain over the source/drain regions 9 between the gate electrodes 5 over the cell region.

Referring to FIG. 1D, using the photo resist pattern 14 as a mask, the polysilicon layer 13 is anisotropically etched to form node contact pads 13a and 13b and a bitline contact pad 13c.

Referring to FIG. 1E, contact holes are formed to expose the source/drain regions 9 over the core and periphery regions. Subsequently, a conductive material such as aluminum, tungsten, or polysilicon is deposited on the entire surface and patterned to form node contact wire layers 15a and 15b on the node contact pads 13a and 13b, respectively, a bitline contact wire layer 15c on the bitline contact pad 13c, $n^+$-type wire layers 16a and 16b contacting with the source/drain regions 9 in the core and periphery regions, and $p^+$-type wire layers 17a and 17b contacting with the source and drain regions 9 in the second conductive type well 3 in the core and periphery regions, thereby completing the process steps of the conventional method for forming contact wires of a semiconductor device.

However, the conventional method has problems. Contact hole aspect ratios tend to be high, e.g., higher than 4, so the process tolerance must be made tighter. There is no pad for wire formation in core and periphery regions, which exaggerates miss-alignment.

SUMMARY OF THE INVENTION

Therefore, the present invention is directed to a method for forming a structure of wires for a semiconductor device that substantially obviates one or more of the problems due to limitations and disadvantages of the related art.

An object of the invention is to provide a method for forming a structure of wires for a semiconductor device in which, in the case that the contact aspect ratio of corresponding contact holes is high, stable wires are formed in cell, core, and periphery regions.

To achieve these and other advantages and in accordance with the purpose of the present invention, as embodied and broadly described, there is provided a method of forming a structure of wires for a semiconductor device and the structure formed thereby, the semiconductor device including a semiconductor substrate arranged into cell regions and at least one of a periphery region and a core region, the at least one of the Periphery and core regions having a well formed thereunder, the semiconductor substrate being arranged into active regions and field regions, the semiconductor device also having field insulating layers in said field regions, a plurality of gate structures on portions of said semiconductor substrate in said active regions, and impurity regions in said semiconductor substrate between said gate structures, the method comprising the steps of: forming an interlayer insulating structure on said semiconductor device; forming contact holes through said interlayer insulating structure to expose said impurity regions; lining contact-hole-portions of said interlayer insulating layer with portions of a barrier layer, respectively, such that said portions of said barrier layer contact said impurity regions; forming conductive pads on said portions of said barrier layer such that remainders of said contact holes are filled; and forming a wire layer on each one of said conductive pads.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

FIGS. 2A to 2E are cross-sectional views showing process steps of a method for forming wires of a semiconductor device. A cell region is shown at the left hand side of the figures and a core or periphery region is shown at the right hand side of the figures. The process steps in both the cell region and the core or periphery region are simultaneously performed.

Figure 1A:
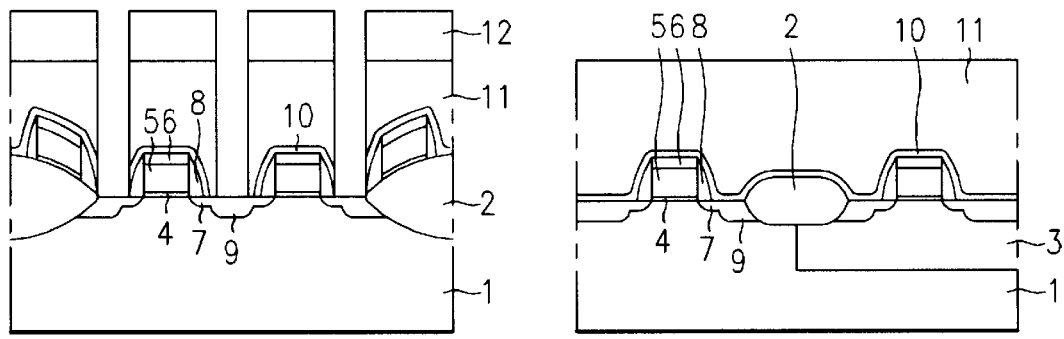
FIGS. 1A to 1E are cross-sectional views showing process steps of a conventional method for forming wires of a semiconductor device.
Figure 1B:
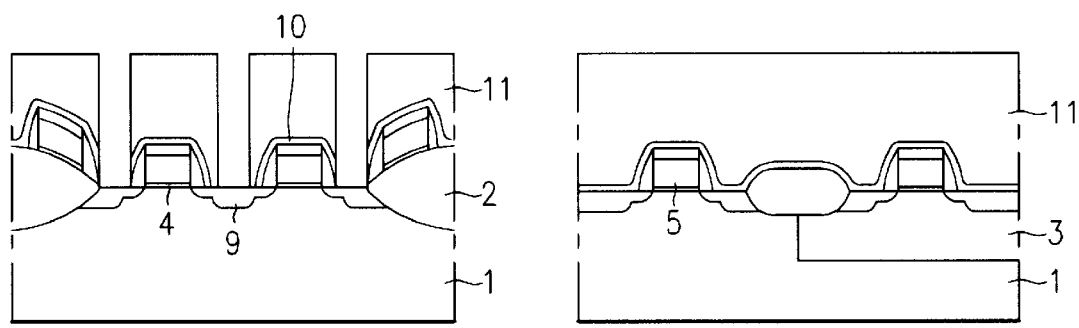
Figure 1C:
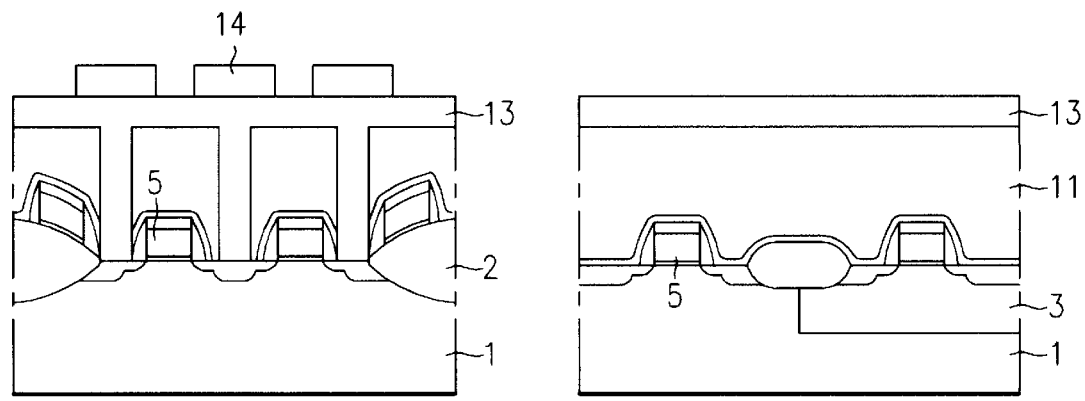
Figure 1D:
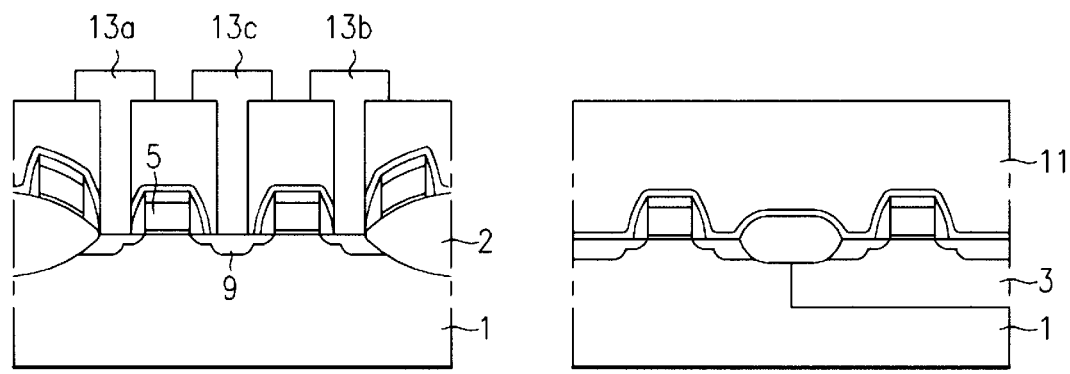
Figure 1E:
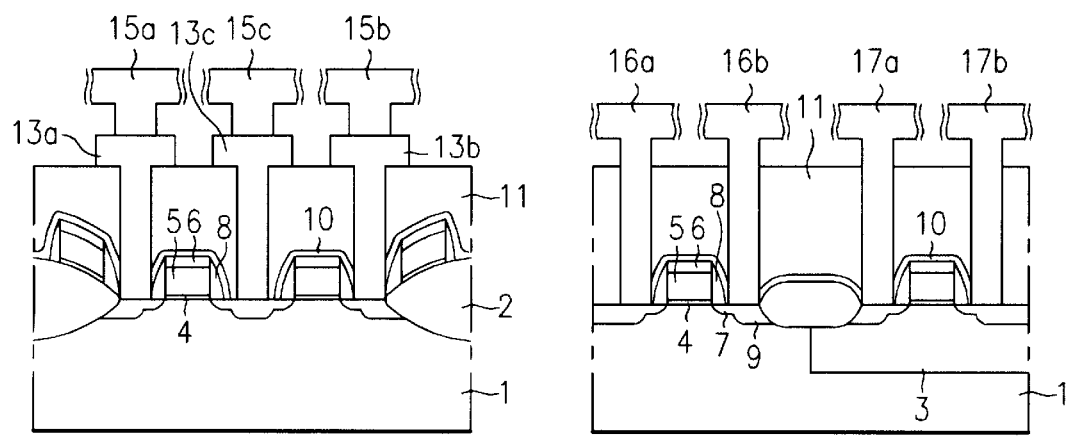
Figure 2A:
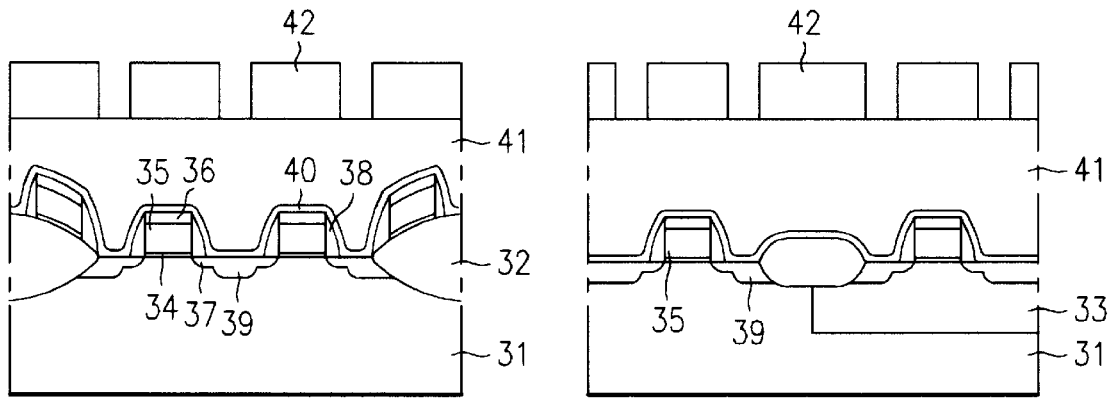
FIGS. 2A to 2E are cross-sectional views showing process steps of a method for forming wires of a semiconductor device according to a preferred embodiment of the present invention.

Referring initially to FIG. 2A, a photo resist film (not shown) is coated on a p-type semiconductor substrate 31 and patterned by an exposure and development process to define an active region and a field region. Subsequently, a thermal oxidation process is performed to form field oxide layers 32. Then, an n-type well 33 is formed beneath a predetermined area of surface of the semiconductor substrate 31 in the core and periphery regions.

Next, a first oxide layer, a polysilicon layer, and a second oxide layer are successively formed on the entire surface. Using a mask for gate formation, a photo etching process is performed to form gate oxide layers 34, gate electrodes 35, and gate cap insulating layers 36 which are stacked. A gate oxide layer, a gate electrode and a gate cap insulating layer represent a gate structure. Thereafter, lightly doped impurity ions are implanted into the semiconductor substrate 31 at both sides of every gate electrode 35 so as to form LDD regions 37. Then, a third oxide layer is deposited and etched-back to form a sidewall insulating layer 38 on both sides of every gate electrode 35.

Using the gate electrode 35 and the sidewall insulating layer 38 as masks, heavily doped impurity ions are implanted into the semiconductor substrate 31 to form source and drain regions 39. Subsequently, either a thin oxide layer or a thin nitride layer is deposited to form a first interlayer insulating layer 40. A second interlayer insulating layer 41 is deposited on the first interlayer insulating layer 40. A photo resist film 42 is coated on the entire surface and patterned by an exposure and development process over predetermined areas for forming contact holes.

Figure 2B:
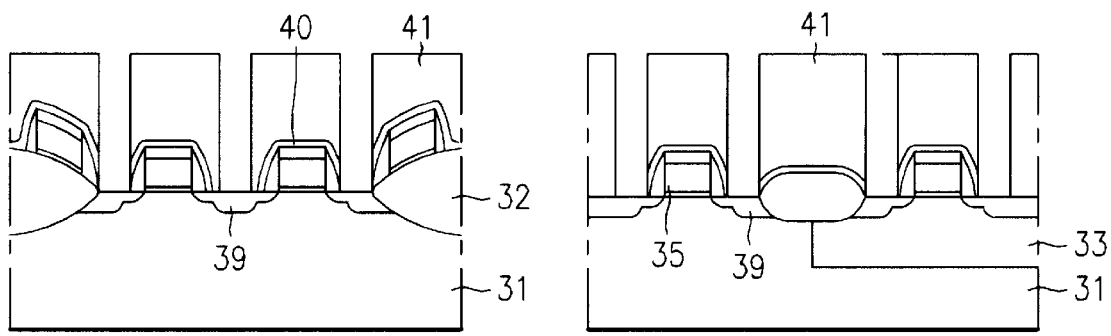

Referring to FIG. 2B, using the photo resist pattern 42 as a mask, the first and second interlayer insulating layer 40 and 41 are anisotropically etched to form contact holes on both sides of every gate electrode 35 so as to expose the source and drain regions 39. In the cell region, the contact holes are for forming bitline contact pads. In the core and periphery regions, the contact holes are for forming contact pads.

Figure 2C:
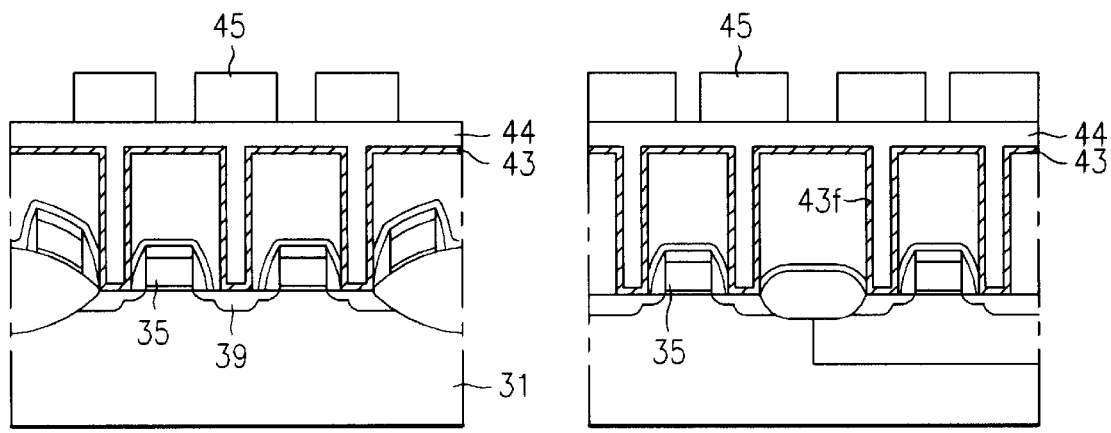

Referring to FIG. 2C, a diffusion barrier metal layer 43 is deposited so as to line the contact holes, and it functions to prevent node contact pads 44a and 44b and a bitline contact pad 44c (over the cell region) and the poly pads (doped by n⁺ or p⁺ ions) 44d, 44e, 44f, and 44g (over the core or periphery regions) (see FIG. 2D) from diffusing into the source and drain regions 39. Subsequently, a polysilicon layer 44, which is not doped, is deposited over the cell region and over the core or periphery region. Next, n-type ions such as phosphorus ions or arsenic ions are doped into the polysilicon layer 44. Accordingly the polysilicon layer 44 becomes an n-type doped polysilicon layer 44. Next, a photo resist film 45 is coated on the entire surface and patterned by an exposure and development process. At this time, the polysilicon layer 44 is simultaneously patterned.

Figure 2D:
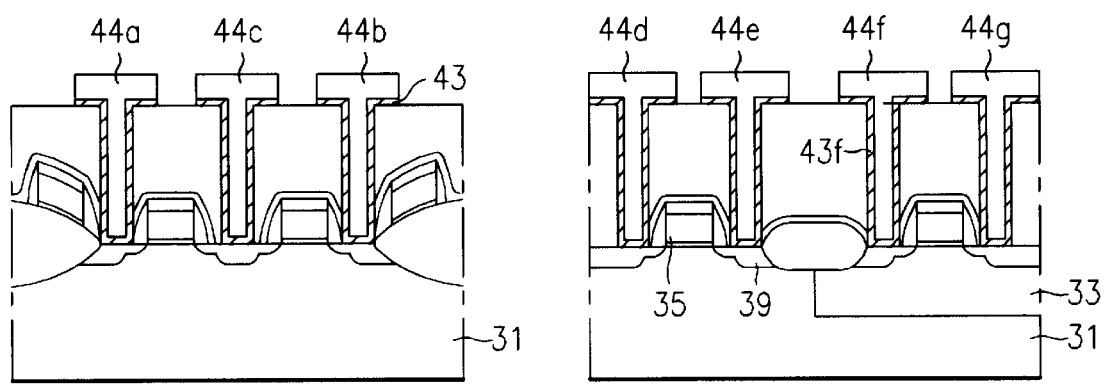

Referring to FIG. 2D, using the photo resist pattern 45 as a mask, the polysilicon layer 44 is anisotropically etched to form node contact pads 44a and 44b and a bitline contact pad 44c over the cell region and poly pads 44d, 44e, 44f, and 44g over the core and periphery regions for ohmic contact with the source and drain regions 39. Each of these pads has an ohmic contact with the source and drain regions 39 via the diffusion barrier metal layer 43 which is made, e.g., of one or more of TiW, TiN, TiC, TiB, TiSi₂, and Ti.

Figure 2E:
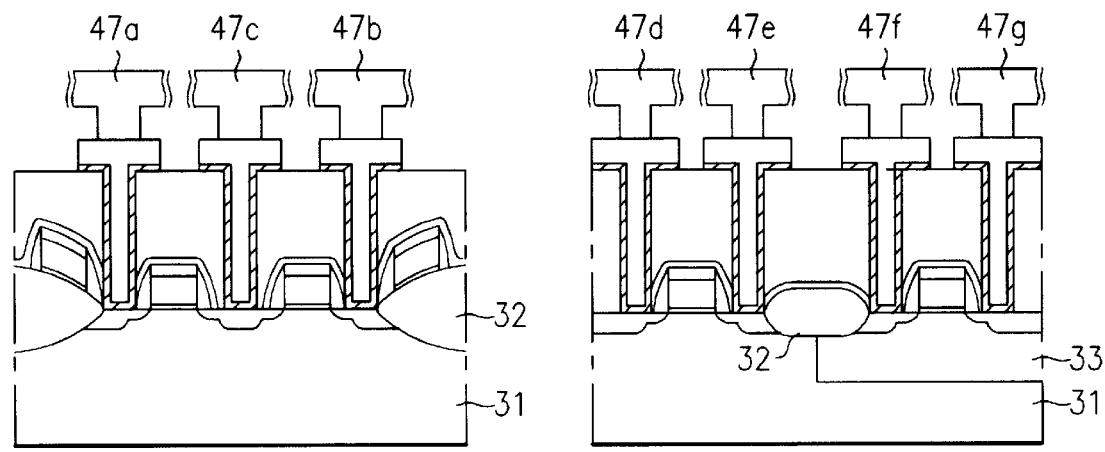

Referring to FIG. 2E, a conductive material such as aluminum, tungsten, or polysilicon is deposited on the entire surface and then patterned to form node contact wire layers 47a and 47b and a bitline contact wire layer 47c over the cell region and poly pad wire layers 47d to 47g contacting with poly pads 44d to 44g, respectively, over the core and periphery regions, thus completing the process steps of the method for forming wires of a semiconductor device.

The relative conductivity types of the preferred embodiment are based upon a p-type semiconductor substrate. An alternative embodiment would be to use an n-type semiconductor substrate and to reverse the conductivity types of the other structures accordingly. Such an alternative would be understood by a person having ordinary skill in this art and need not be discussed further.

The method for forming wires of a semiconductor device has the following advantages. First, since pads are formed in a medium height over a cell region as well as over core and periphery regions, good process tolerance is easily obtained. Furthermore, the diffusion barrier metal layer is formed between the source/drain regions and poly pads and prevents diffusion into the source/drain regions, i.e., unwanted additional doping of the source/drain regions. Also, the number of masking process is reduced because the core or periphery area need not be processed separately from the cell area, thus improving productivity.

It will be apparent to those skilled in the art that various modification and variations can be made in the method for forming wires of a semiconductor device of the present invention without departing from the spirit or scope of the inventions. Thus, it is intended that the present invention cover the modifications and variations of this invention provided they come within the scope of the appended claims and their equivalents.

What is claimed is:

1. A method for forming wires of a semiconductor device, the method comprising:

providing a semiconductor substrate of a first conductivity type having a cell region and at least one of a periphery region and a core region defined therein;

defining active regions and field regions on a surface of the semiconductor substrate;

forming field insulating layers on the field regions;

forming a well of a second conductivity type in a portion of the semiconductor substrate located in the periphery region;

forming a plurality of gate structures on portions of the semiconductor substrate;

forming impurity regions in the semiconductor substrate at both sides of each one of the gate structures;

forming an interlayer insulating structure on all exposed surfaces of the gate structures and the semiconductor substrate;

simultaneously forming all contact holes that extend through said interlayer insulating structure and which expose said impurity regions;

forming a barrier layer on said interlayer insulating structure so as to line said contact holes and to be in contact with the impurity regions;

simultaneously forming doped polysilicon pads on said barrier layer in said cell region and said periphery region so as to fill said contact holes; and forming a wire layer on each of the doped polysilicon pads.

2. The method as claimed in claim 1, wherein the barrier layer is a silicide layer made of a compound metal of a refractory metal and any one of C, B, and N.

3. The method as claimed in claim 1, wherein the barrier layer includes one or more of TiW, TiN, TiC, TiB, $TiSi_2$, and Ti.

4. The method as claimed in claim 1, wherein the dopants of said polysilicon pads are elements of either the third group or the fifth group of the periodic table of the elements.

5. The method as claimed in claim 4, wherein the polysilicon pads are doped by at least one of p-type boron ions, and n-type arsenic ions, n-type phosphorus ions, and p-type gallium ions.

6. The method as claimed in claim 1, wherein said first conductivity type is p-type and said second conductivity type is n-type.

7. A method of forming a structure of wires for a semiconductor device, the semiconductor device including a semiconductor substrate arranged into cell regions and at least one of a periphery region and a core region, the at least one of the periphery and core regions having a well formed thereunder, the semiconductor substrate being arranged into active regions and field regions, the semiconductor device also having field insulating layers in said field regions, a plurality of gate structures on portions of said semiconductor substrate in said active regions, and impurity regions in said semiconductor substrate between said gate structures, the method comprising the steps of:

forming an interlayer insulating structure on said semiconductor device;

simultaneously forming all contact holes that extend through said interlayer insulating structure and which expose said impurity regions;

lining contact-hole portions of said interlayer insulating layer with portions of a barrier layer, respectively, such that said portions of said barrier layer contact said impurity regions;

simultaneously forming doped polysilicon pads on said portions of said barrier layer in said cell regions and said at least one periphery region such that remainders of said contact holes are filled; and forming a wire layer on each on eof said conductive pads.

8. The method as claimed in claim 7, wherein said step of forming said interlayer insulating structure includes:

forming a non-planarizing insulating layer on all exposed surfaces of gate structures and said semiconductor; and forming a planarizing insulating layer on said non-planarizing insulating layer.

9. The method as claimed in claim 7, wherein said step of lining includes:

forming said interlayer insulating structure with said barrier layer;

forming a conductive layer on said barrier layer such that remainders of said contact holes are filled; and selectively removing portions of said conductive layer and said barrier layer above said gate electrode structures.

10. The method as claimed in claim 7, wherein said semiconductor polysilicon is of a p-type conductivity, and said well is of n-type conductivity, and said conductive pads are at least one said p-type and said n-type conductivity.

11. The method as claimed in claim 7, wherein said barrier layer is a silicide.

12. The method as claimed in claim 7, wherein said barrier layer is one of TiW, TiN, TiC, TiB and Ti.

13. The method as claimed in claim 7, wherein said conductive layer is doped polysilicon.

14. A method for forming wires of a semiconductor device, the method comprising:

providing a semiconductor substrate of a first conductivity type having a cell region and at least one of a periphery region and a core region defined therein;

defining active regions and field regions on a surface of the semiconductor substrate;

forming field insulating layers on the field regions;

forming a well of a second conductivity type in a portion of the semiconductor substrate located in the periphery region;

forming a plurality of gate structures on portions of the semiconductor substrate;

forming impurity regions in the semiconductor substrate at both sides of each one of the gate structures;

forming an interlayer insulating structure on all exposed surfaces of the gate structures and the semiconductor substrate;

simultaneously forming all contact holes that extend through said interlayer insulating structure and which expose said impurity regions;

forming a barrier layer on said interlayer insulating structure so as to line said contact holes and to be in contact with the impurity regions;

forming doped polysilicon pads on said barrier layer so as to fill said contact holes, the dopants being elements of either the third group or the fifth group of the periodic table of the elements; and forming a wire layer on each of the doped polysilicon pads.

15. The method as claimed in claim 14, wherein the polysilicon pads are doped by at least one of p-type boron ions, and n-type arsenic ions, n-type phosphorus ions, and p-type gallium ions.

16. A method of forming a structure of wires for a semiconductor device, the semiconductor device including a semiconductor substrate arranged into cell regions and at least one of a periphery region and a core region, the at least one of the periphery and core regions having a well formed thereunder, the semiconductor substrate being arranged into active regions and field regions, the semiconductor device also having field insulating layers in said field regions, a plurality of gate structures on portions of said semiconductor substrate in said active regions, and impurity regions in said semiconductor substrate between said gate structures, the method comprising the steps of:

forming an interlayer insulating structure on said semiconductor device;

simultaneously forming all contact holes that extend through said interlayer insulating structure and which expose said impurity regions;

lining contact-hole portions of said interlayer insulating layer with portions of a barrier layer, respectively, such that said portions of said barrier layer contact said impurity regions;

forming doped polysilicon pads on said portions of said barrier layer such that remainders of said contact holes are filled, the dopants being elements of either the third group or the fifth group of the periodic table of the elements; and forming a wire layer on each on eof said conductive pads.

17. The method as claimed in claim 16, wherein the polysilicon pads are doped by at least one of p-type boron ions, and n-type arsenic ions, n-type phosphorus ions, and p-type gallium ions.

* * * * *